(12) United States Patent
Kim et al.

(10) Patent No.: US 8,592,318 B2
(45) Date of Patent: Nov. 26, 2013

(54) PITCH REDUCTION USING OXIDE SPACER

(75) Inventors: Jisoo Kim, Pleasanton, CA (US); Conan Chiang, Cupertino, CA (US); Jun Shinagawa, San Jose, CA (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 307 days.

(21) Appl. No.: 12/742,073

(22) PCT Filed: Nov. 7, 2008

(86) PCT No.: PCT/US2008/082915
§ 371 (c)(1),
(2), (4) Date: Sep. 13, 2011

(87) PCT Pub. No.: WO2009/062123
PCT Pub. Date: May 14, 2009

(65) Prior Publication Data
US 2012/0052683 A1 Mar. 1, 2012

Related U.S. Application Data

(60) Provisional application No. 60/986,467, filed on Nov. 8, 2007.

(51) Int. Cl.
*H01L 21/302* (2006.01)
*B44C 1/22* (2006.01)

(52) U.S. Cl.
USPC ........... 438/694; 438/710; 438/947; 438/948; 438/952; 216/37; 216/58; 216/67

(58) Field of Classification Search
USPC ............ 438/694, 710, 947, 948, 952; 216/37, 216/58, 67
See application file for complete search history.

(56) References Cited

U.S. PATENT DOCUMENTS

| | | | | |
|---|---|---|---|---|
| 2003/0022484 A1* | 1/2003 | Lee | ............................... | 438/637 |
| 2003/0224617 A1* | 12/2003 | Baek et al. | .................... | 438/763 |
| 2005/0029671 A1* | 2/2005 | Kakamu et al. | ............... | 257/774 |
| 2005/0158959 A1 | 7/2005 | Doyle | | |
| 2007/0170146 A1 | 7/2007 | Huang et al. | | |
| 2008/0076070 A1* | 3/2008 | Koh et al. | ...................... | 430/311 |
| 2008/0166854 A1* | 7/2008 | Shin et al. | ...................... | 438/427 |

FOREIGN PATENT DOCUMENTS

| KR | 10-2003-0002145 | 1/2003 |
|---|---|---|
| KR | 10-0761857 | 9/2007 |

* cited by examiner

*Primary Examiner* — Shamim Ahmed
(74) *Attorney, Agent, or Firm* — Beyer Law Group LLP

(57) ABSTRACT

A method for etching an etch layer disposed over a substrate and below an antireflective coating (ARC) layer and a patterned organic mask with mask features is provided. The substrate is placed in a process chamber. The ARC layer is opened. An oxide spacer deposition layer is formed. The oxide spacer deposition layer on the organic mask is partially removed, where at least the top portion of the oxide spacer deposition layer is removed. The organic mask and the ARC layer are removed by etching. The etch layer is etched through the sidewalls of the oxide spacer deposition layer. The substrate is removed from the process chamber.

18 Claims, 9 Drawing Sheets

PITCH REDUCTION USING OXIDE SPACER

BACKGROUND OF THE INVENTION

The present invention relates to the formation of semiconductor devices. More particularly, the invention relates to the formation of semiconductor devices with pitch reduction using oxide spacers.

The packing density of semiconductor devices may increase twice by about every one and half year. The high packing density increases productivity and device speed and also reduces power consumption. However, as the packing density increases, the cost increase and the yield reduction are also exponentially increasing. Since the largest cause of exponential increase of cost and yield reduction may be related to the lithography technology, alternative methods for patterning a mask have been sought to replace optical lithography. One such technology is the double mask scheme which patterns the mask layer twice to make half pitch. However, the double mask method it is limited by precision of overlaying.

In general, spacer lithography provides a sacrificial layer and then etches the sacrificial layer into sacrificial structures. A conformal chemical vapor deposition (CVD) is then used to form a conformal layer over and around the sacrificial structures. An etchback is used to etch the horizontal layers of the conformal layer. The sacrificial structure is then removed to form spacer or fin structures of the conformal layer. Conventionally, the thickness of the spacer may be 10 nm or less. To provide a desired conformal layer, the conventional CVD deposition may require a high temperature CVD. Such high temperatures may be detrimental to the semiconductor device. The high temperature may cause a process to go beyond a device thermal budget. In addition, if doping has previously been done, the high temperature may be detrimental to the doped areas.

In addition, such CVD processes are limited with regards to the sacrificial layer and spacer. Generally, a sacrificial layer of silicon oxide would provide a spacer of silicon nitride. A sacrificial layer of silicon nitride would provide a sacrificial layer of silicon oxide.

SUMMARY OF THE INVENTION

To achieve the foregoing and in accordance with the purpose of the present invention, a method for etching an etch layer disposed over a substrate and below an antireflective coating (ARC) layer and a patterned organic mask with mask features is provided. The substrate is placed in a process chamber. The ARC layer is opened through the mask features of the patterned mask. An oxide spacer deposition layer is formed, where the oxide spacer deposition layer includes a top portion, side walls, and a bottom portion, the top portion covering a top of the organic mask, the side walls covering side walls of the organic mask, and the bottom portion covering a bottom of the mask features. The oxide spacer deposition layer on the organic mask is partially removed, where at least the top portion of the oxide spacer deposition layer is removed. The organic mask and the ARC layer are removed by etching. The etch layer is etched through the sidewalls of the oxide spacer deposition layer. The substrate is removed from the process chamber.

In another manifestation of the invention, computer implemented method for etching an etch layer disposed over a substrate and below an antireflective coating (ARC) layer and a patterned organic mask with mask features is provided. The substrate is placed in a process chamber. The ARC layer is opened through the mask features of the patterned mask. An oxide spacer deposition layer is formed, where the oxide spacer deposition layer includes a top portion, side walls, and a bottom portion, the top portion covering a top of the organic mask, the side walls covering side walls of the organic mask, and the bottom portion covering a bottom of the mask features. The forming of the oxide spacer deposition layer comprises one (1) to twenty (20) cycles, each cycle, comprising a deposition phase including providing a flow of a deposition gas containing Si. forming a plasma from the deposition gas, and stopping the flow of the deposition gas and a treatment phase including providing a flow of a treatment gas containing at least one of $O_2$ or $N_2$, forming a plasma from the treatment gas, and stopping the flow of the treatment gas. The oxide spacer deposition layer on the organic mask is partially removed by etching, where at least the top portion of the oxide spacer deposition layer is removed. The organic mask and the ARC layer are removed by etching. The etch layer is etched through the sidewalls of the oxide spacer deposition layer. The substrate is removed from the process chamber.

In another manifestation of the invention, an apparatus for etching an etch layer over a substrate and below an antireflective coating (ARC) layer and a patterned organic mask with mask features is provided. A plasma processing chamber is provided, comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet, and comprises an ARC opening gas source, a Si containing deposition gas source, an $O_2$ or $N_2$ containing treatment gas source, an oxide spacer removal gas source, an organic mask and ARC layer removal gas source, and an etch gas source. A controller is controllably connected to the gas source and the at least one electrode, and comprises at least one processor and computer readable media. The computer readable media comprises computer readable code for opening the ARC layer through the mask features of the patterned mask, computer readable code for forming an oxide spacer deposition layer, the oxide spacer deposition layer including a top portion, side walls, and a bottom portion, the top portion covering a top of the organic mask, the side walls covering side walls of the organic mask, and the bottom portion covering a bottom of the mask features, which comprises one (1) to twenty (20) cycles, where each cycle, comprises computer readable code for providing a deposition phase including, computer readable code for providing a flow of a deposition gas containing Si, computer readable code for forming a plasma from the deposition gas, and computer readable code for stopping the flow of the deposition gas and computer readable code for providing a treatment phase including computer readable code for providing a flow of a treatment gas containing at least one of $O_2$ or $N_2$, computer readable code for forming a plasma from the treatment gas, and computer readable code for stopping the flow of the treatment gas, computer readable code for partially removing, by etching, the oxide spacer deposition layer on the organic mask, at least the top portion of the oxide spacer deposition layer being removed, computer readable code for removing, by etching, the organic mask and the ARC layer, and computer readable code for etching the etch layer through the sidewalls of the oxide spacer deposition layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
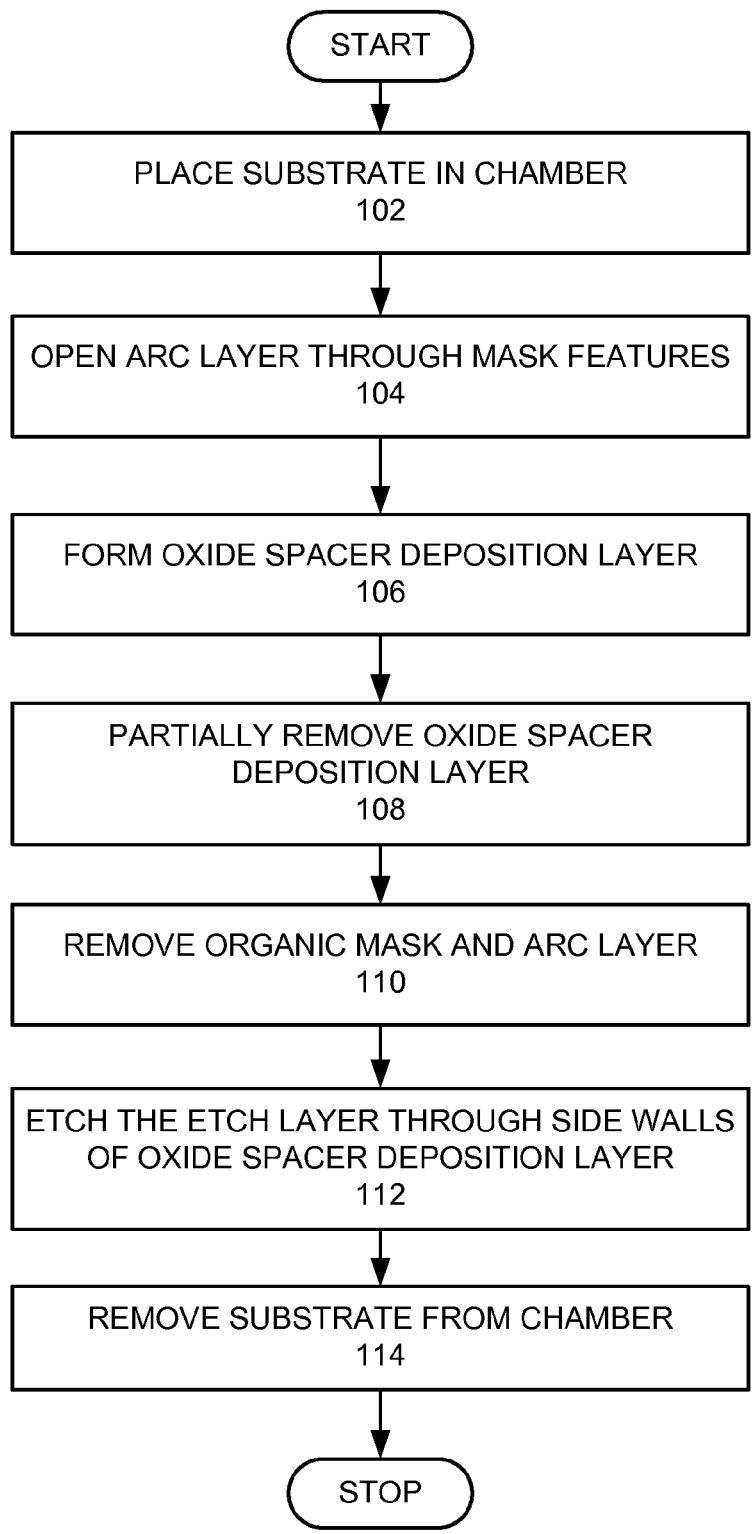
FIG. 1 is a high level flow chart of a process that may be used in an embodiment of the invention.
Figure 2A:
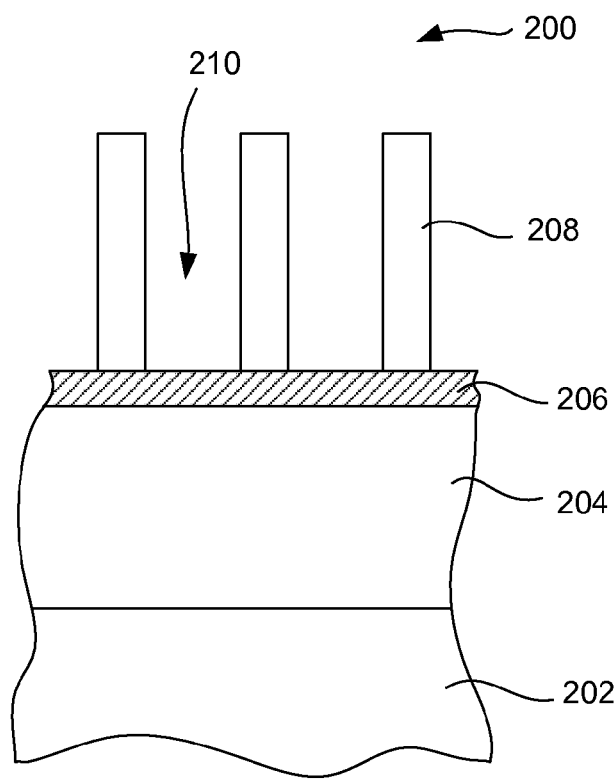
FIGS. 2A-F are schematic cross-sectional views of a stack processed according to an embodiment of the invention.

To facilitate understanding, FIG. 1 is a high level flow chart of a process that may be used in an embodiment of the invention, which etches an etch layer disposed over a substrate and below an antireflective coating (ARC) layer and a patterned organic mask with mask features. A substrate is placed in a process chamber (step 102). FIG. 2A is a schematic cross-sectional view of a stack 200 of layers provided on a substrate 202 in accordance with one embodiment of the present invention. As shown in FIG. 2A, an etch layer 204 is disposed over the substrate 202 and below an ARC layer 206 and a patterned organic mask 208. In this example, the substrate 202 may be a silicon wafer. The patterned organic mask 208 has mask features 210. The organic mask 208 may be a photoresist (PE) or an amorphous carbon mask. Amorphous carbon is similar to a polymer, but with less hydrogen and more carbon since it is deposited at high temperature greater than 200° C. by CVD, and thus it is more etch resistant than polymer. The ARC layer 206 may include a bottom antireflective coating (BARC) and/or a dielectric antireflective coating (DARC) layer. The etch layer 204 may be a dielectric layer such as a nitride or oxide, for example, silicon nitride (SiN) or silicon oxide ($SiO_2$). The etch layer may also be polysilicon, amorphous carbon, or other mask.

Figure 2B:
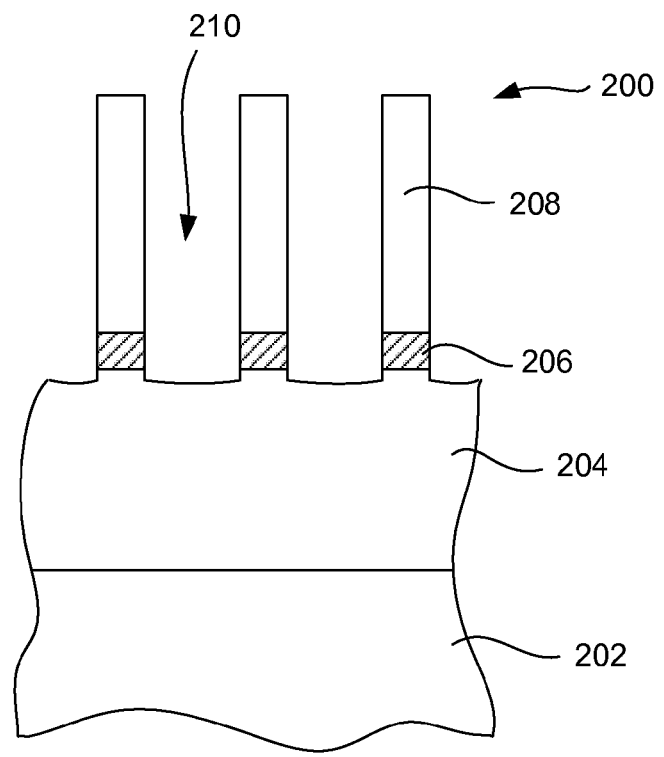
Figure 2C:
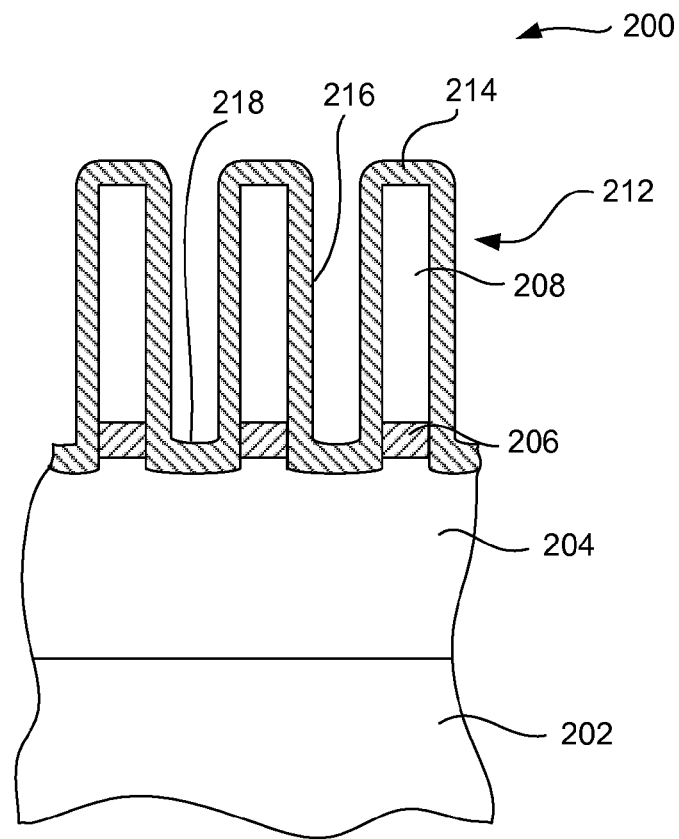

Referring back to FIG. 1, the ARC layer 206 is opened through the mask features 210 of the patterned mask 208 (step 104). The ARC opening (step 104) may use any conventional etchant gas to open the ARC layer 206. FIG. 2B is a schematic cross-sectional view of the stack 200 where the ARC layer 206 is opened. Then, an oxide spacer deposition layer is formed (step 106). FIG. 2C is a schematic cross-sectional view of the stack 200 where the oxide spacer deposition layer 212 is formed on the substrate 202. As shown in FIG. 2C, the oxide spacer deposition layer 212 includes a top portion 214, side walls 216, and a bottom portion 218. The top portion 214 covers the top of the organic mask 208. The side walls 216 of the oxide spacer deposition layer 212 cover corresponding side walls of the organic mask 208. The bottom portion 218 of the oxide spacer deposition layer 212 covers a respective bottom of the mask features.

Figure 2D:
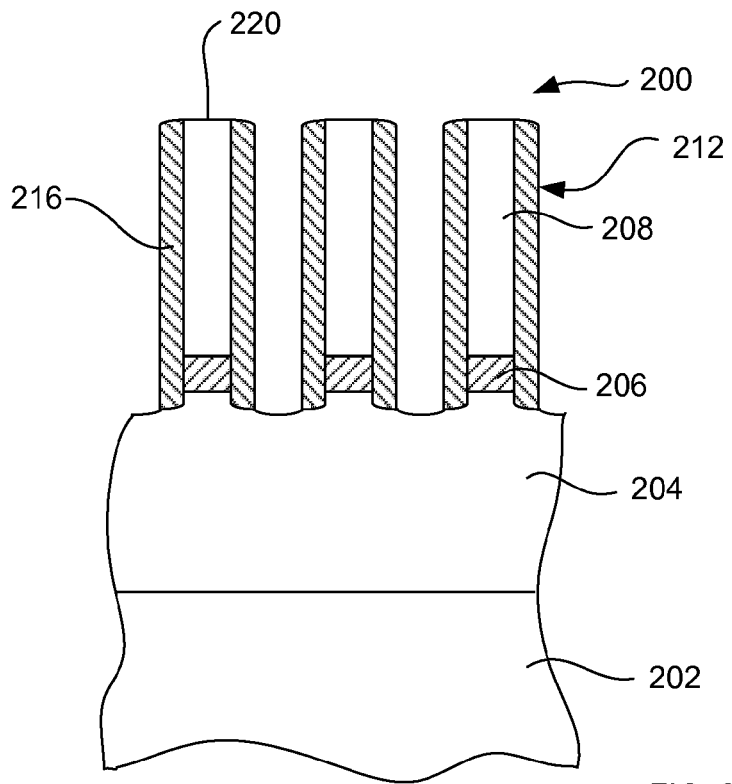

The oxide spacer deposition layer 212 on the organic mask 208 is partially removed by etching (step 108). In step 108, at least the top portion 214 of the oxide spacer deposition layer 212 is removed such that the top 220 of the organic mask is exposed. FIG. 2D a schematic cross-sectional view of the stack 200 after the partial removal of the oxide spacer deposition layer 212. As shown in FIG. 2D, the bottom portion 218 of the oxide spacer deposition layer 212 may also removed by the step 108 so as to clear the bottom of the features.

Figure 2E:
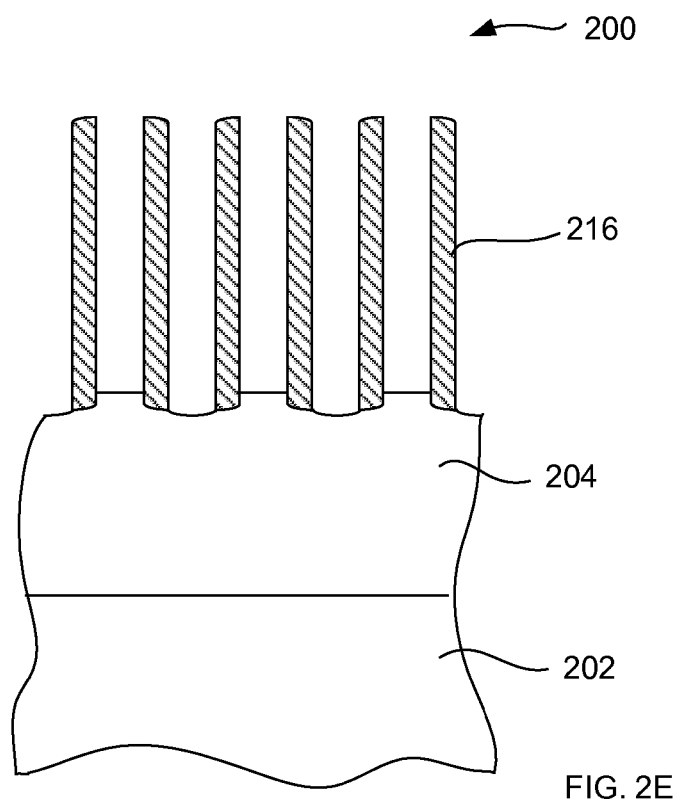
Figure 2F:
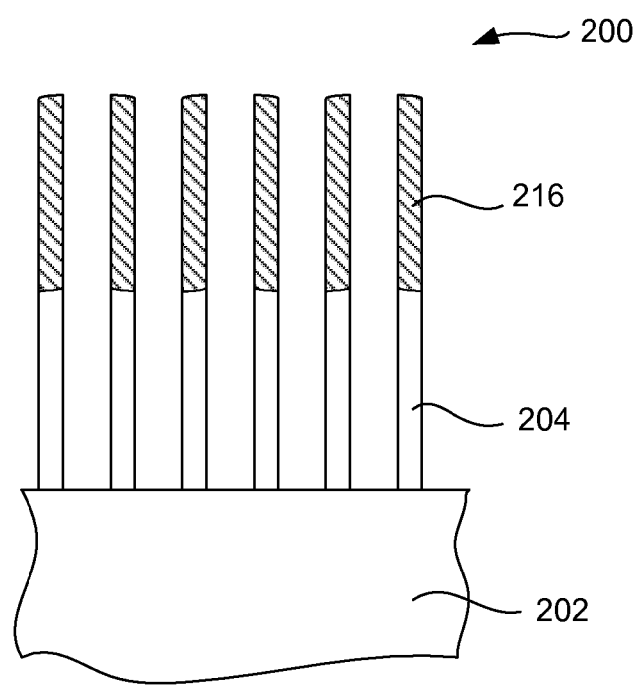

The organic mask 208 and the ARC layer 206 are then removed by etching (step 110). FIG. 2E is a schematic cross-sectional view of the stack 200 where the organic mask 208 and the ARC layer 206 have been removed. As shown in FIG. 2E, the sidewalls 216 of the oxide spacer deposition layer 208 are remaining over the etch layer. Since the sidewalls 216 are formed on both sides of the patterned organic mask 208, and then the organic mask 208 between the sidewalls 216 is removed, the resulting pattern of the oxide sidewalls 216 have about twice the pitch of the patterned organic mask 208. For example, in FIG. 2A, the width of the patterned organic mask 208 may have a critical dimension (CD) of about 48 nm and the space between the mask pattern may be about 95 nm. In FIG. 2F, the etched pattern has a CD of about 21 nm and the space of about 48-50 nm.

The etch layer 204 is etched through the sidewalls 216 of the oxide spacer deposition layer using the sidewalls 216 as an etch mask (step 112). FIG. 2F is a schematic cross-sectional view of the stack 200 where the etch layer 204 is etched. It should be noted that the step 108 and the step 110 may be performed continuously as a single step using the same chemistry in accordance with one embodiment of the present invention.

Then, the stack 200 (substrate 202) is removed from the process chamber (step 114). Thus, the step 104 through the step 112 are performed in the same chamber, i.e., in situ. Also, in accordance with one embodiment of the present invention, all of the processes are performed at a room temperature, and thus a high temperature of the conventional CVD process is not required.

Figure 3:
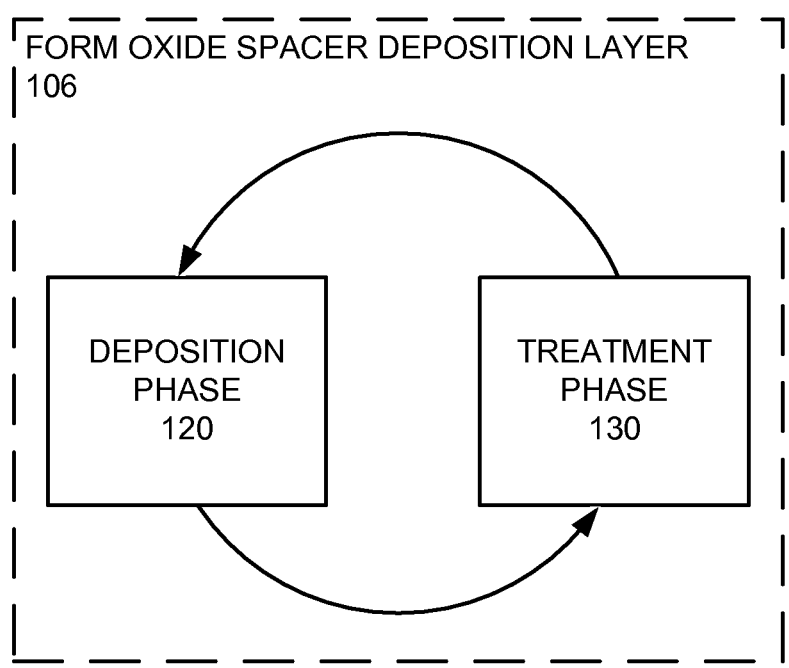
FIG. 3 is a more detailed flow chart of forming the oxide spacer deposition layer.

FIG. 3 is a more detailed flow chart for forming the oxide spacer deposition layer 212 covering the patterned organic mask 208 and the bottom of the mask features 210 (step 106). Forming of the oxide spacer deposition layer 212 includes one or more cycles, preferably, a plurality of cycles.

Figure 4:
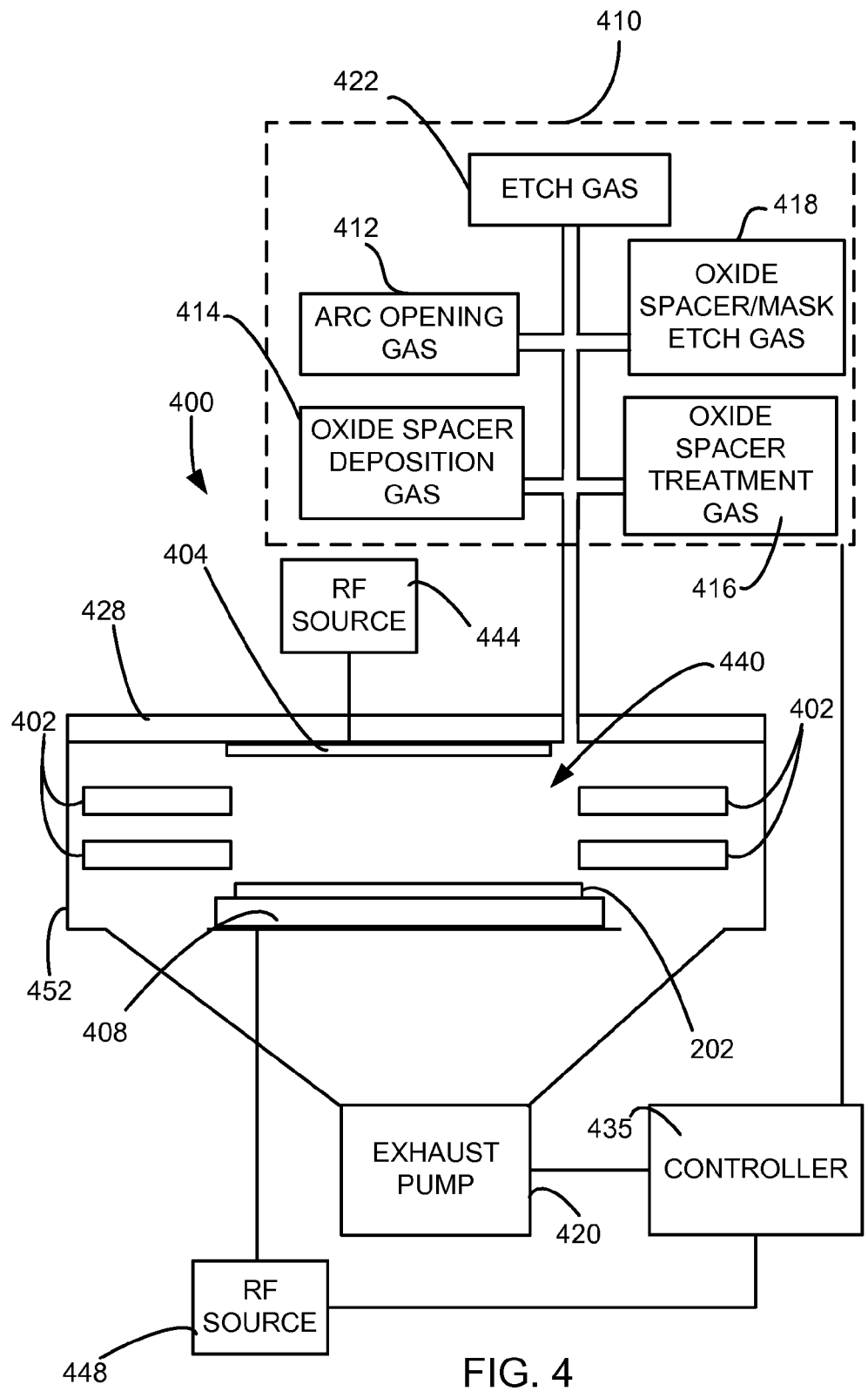
FIG. 4 is a schematic view of a plasma processing chamber that may be used in practicing the invention.

FIG. 4 is a schematic view of a processing chamber 400 that may be used to etch an etch layer to achieve a reduced pitch of the etch features. The etch layer is disposed over a substrate and below an antireflective coating (ARC) layer and a patterned organic mask with mask features, for example, as shown in FIG. 2A. The plasma processing chamber 400 comprises confinement rings 402, an upper electrode 404, a lower electrode 408, a gas source 410, and an exhaust pump 420. The gas source 410 comprises an ARC opening gas source 412, an oxide spacer deposition gas source 414, an oxide spacer treatment gas source 416, an oxide spacer/mask etching gas source 418, and an etch layer etch gas source 422. The gas source 410 allows opening of the ARC layer through etching of the etch layer (for example, dielectric layer) to be done in situ in the same chamber 400. The oxide spacer/mask etching gas source 418 may be a single gas source, or may include a first etching gas source (not shown) for partially removing the oxide spacer deposition layer and a second etching gas source (not shown) for removing the organic mask and the remaining ARC layer. However, the first and second etching gas sources may be combined, if both processes use the same component gases. The flow rate of each of the component gases may be controlled so that the partial removing of the oxide spacer deposition layer and the etching of the organic mask and the ARC layer have a respective set of suitable flow ratios of the component gases.

Within plasma processing chamber 400, the substrate 202 with the stack 200 is positioned upon the lower electrode 408. The lower electrode 408 incorporates a suitable substrate chucking mechanism (e.g., electrostatic, mechanical clamping, or the like) for holding the substrate 202. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume 440 by the gas source 410 and is exhausted from the confined plasma volume 440 through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source, a 2 MHz power source, and a 60 MHz power source. Different combinations of connecting RF power to the electrode are possible. In the case of Lam Research Corporation's Dielectric Etch Systems such as Exelan® Series, made by LAM Research Corporation™ of Fremont, Calif., which may be used in a preferred embodiment of the invention, the 27 MHz, 2 MHz, and 60 MHz power sources make up the second RF power source 448 connected to the lower electrode 408. In other embodiments, the RF power source may have a frequency up to 300 MHz.

A controller 435 is controllably connected to the RF sources 444, 448, exhaust pump 420, and the gas source 410. The Dielectric Etch System would be used when the layer to be etched 204 is a dielectric layer, such as silicon oxide, silicon nitride, or organo silicate glass. The controller 435 controls the RF sources 444, 448, exhaust pump 420, and the gas source 410. The controller also controls the oxide spacer deposition gas source 414 and the oxide spacer treatment gas source 416 so as to alternately perform the oxide spacer deposition phase and the oxide spacer treatment phase as the two phases of each cycle of a plurality of cycles.

Figure 5A:
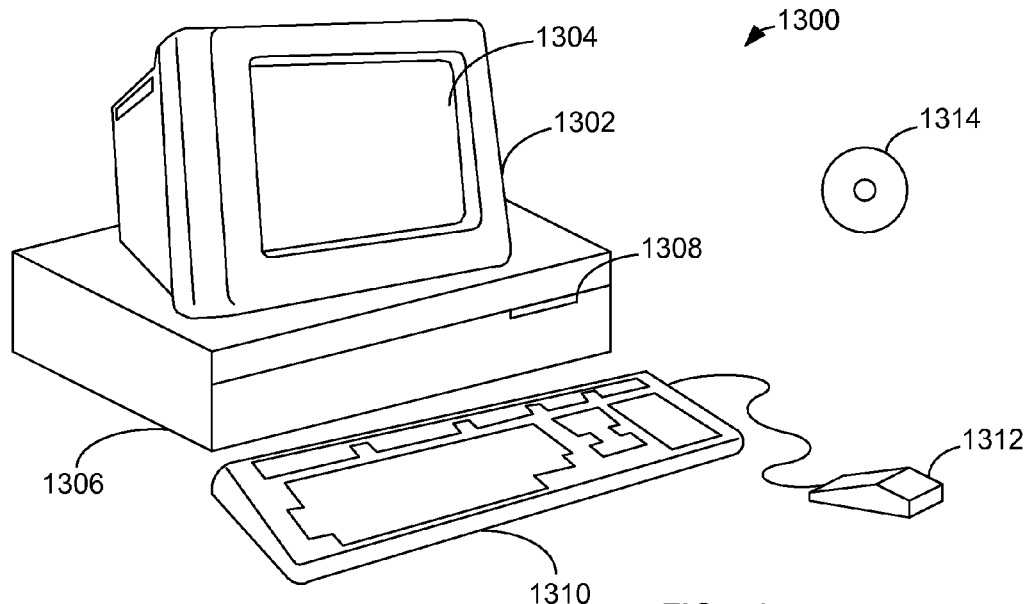
FIGS. 5A-B illustrate a computer system, which is suitable for implementing a controller used in embodiments of the present invention.
Figure 5B:
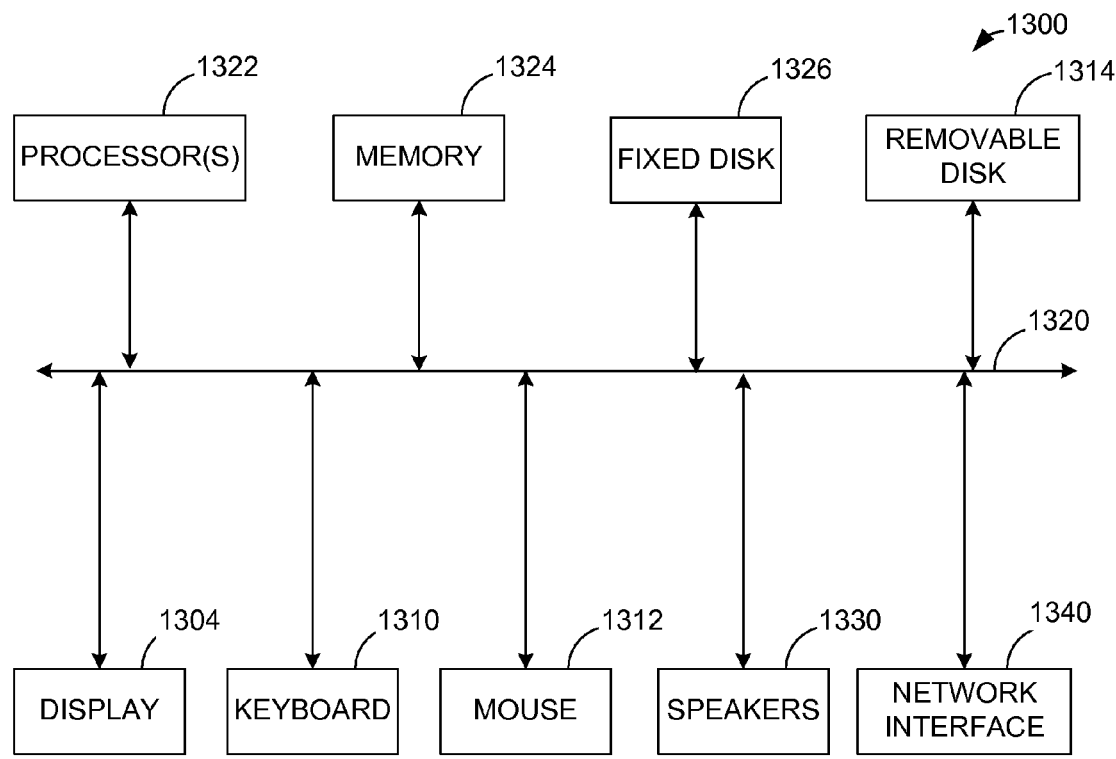

FIGS. 5A and 5B illustrate a computer system 1300, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 5B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Referring back to FIG. 3, as mentioned above, the forming of the oxide spacer deposition layer 212 (step 106) includes one or more cycles, and each cycle includes a deposition phase 120 and a treatment phase 130. For example, forming the oxide spacer deposition layer may include one (1) to twenty (20) cycles, preferably, three (3) to fifteen (15) cycles, and more preferably, about ten (10) cycles. In the deposition phase 120, a deposition gas containing Si may be used. In accordance with one embodiment of the present invention, the deposition gas includes Silane and hydrocarbon. In this specification and claims, "hydrocarbon" includes both hydrocarbon and fluorohydrocarbon. For example, the deposition gas includes $SiH_4$ and $CH_3F$, and additionally Ar as a carrier gas. Other hydrocarbons such as $C_xH_yF$, or $C_xH_y$ may also be used. The carrier gas may be one or more of He, Ar, Ne, Kr, Xe etc. In accordance with one embodiment of the present invention, the deposition gas is substantially oxygen free. In the treatment phase 130, a treatment gas containing at least one of $O_2$ or $N_2$ may be sued.

Figure 6:
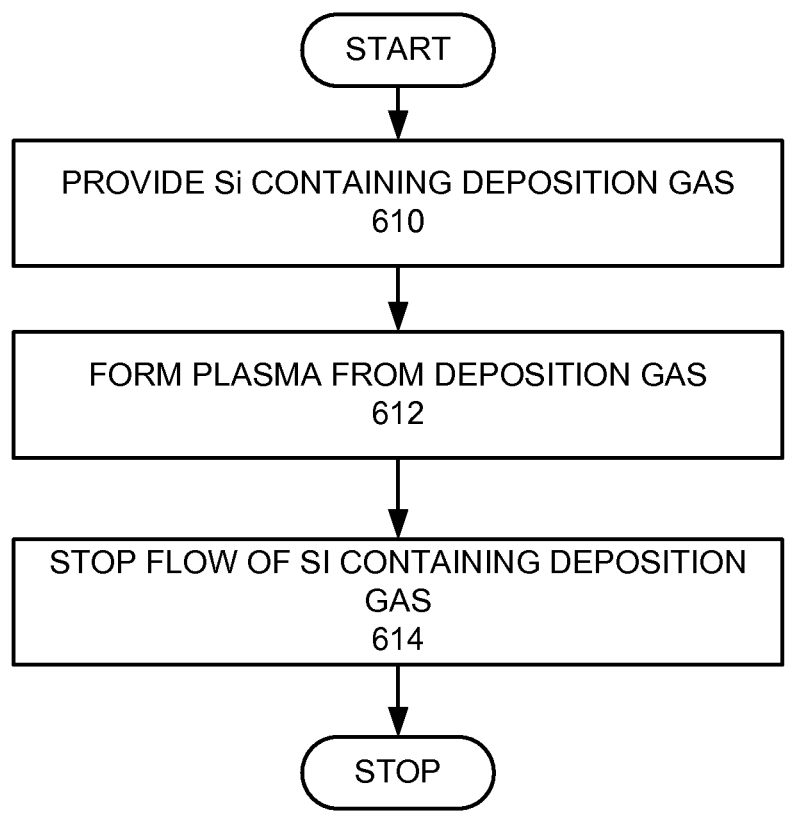
FIG. 6 is a more detailed flow chart of the oxide spacer deposition phase.

FIG. 6 is a more detailed flow chart of the oxide spacer deposition phase 120. An example of the oxide spacer deposition phase (step 120) provides a flow of 10 sccm $CH_3F$, 5 sccm $SiH_4$, and 995 sccm Ar. The pressure is set to 280 mTorr. The substrate is maintained at a room temperature, for example, about 20° C. The second RF source 448 provides 600 Watts at a frequency of 60 MHz. Preferably, the deposition gas is substantially oxygen free. During the deposition phase, as shown in FIG. 6, the deposition gas containing Si is provided (step 610), a plasma is formed from the deposition gas (step 612), and then the flow of the Si containing gas is stopped (step 614).

Figure 7:
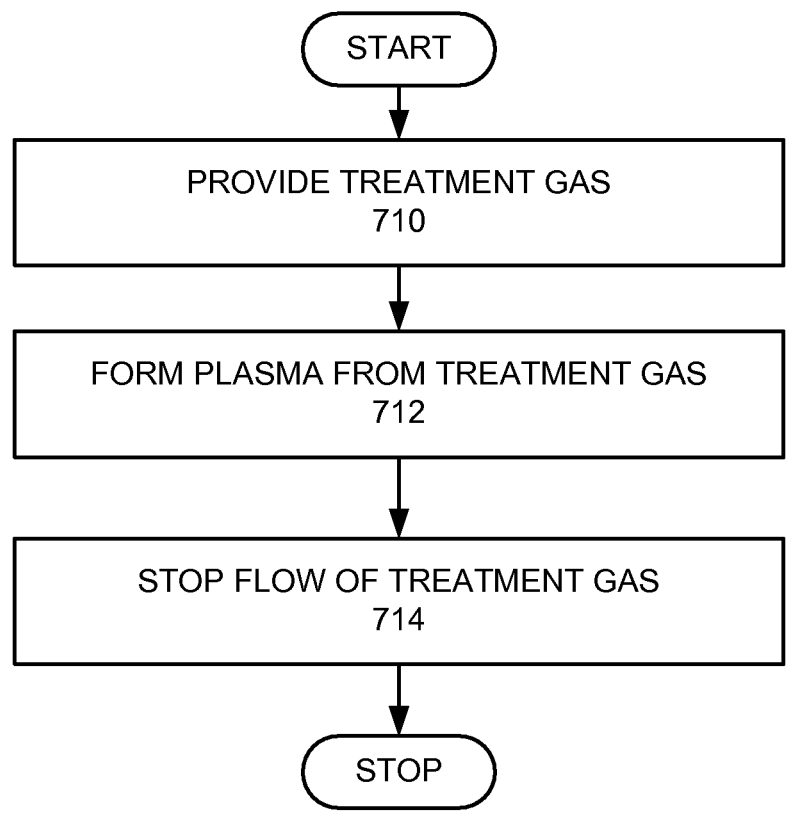
FIG. 7 is a more detailed flow chart of the oxide spacer treatment phase.

FIG. 7 is a more detailed flow chart of the oxide spacer treatment phase 130. An example of the oxide spacer treatment phase (step 130) provides a flow of –450 sccm $O_2$. The pressure is set to 180 mTorr. The substrate is maintained at a room temperature, for example, about 20° C. The second RF source 448 provides 400 Watts at a frequency of 60 MHz. During the treatment phase, as shown in FIG. 7, the treatment gas is provided (step 710), a plasma is formed from the treatment gas (step 712), and then the flow of the treatment gas is stopped (step 714).

The power and pressure of the oxide spacer deposition phase and oxide spacer treatment phase are carefully selected to reduce any striation and wiggling of the organic mask patterns. For the oxide spacer deposition phase an example of a preferred pressure range would be 40 to 800 mTorr and an example of a preferred power range would be 200 to 1000 Watts at a frequency of 60 M Hz, 200 to 1000 Watts at a frequency of 27 MHz and/or 200 to 1000 Watts at a frequency of 2 M Hz.

By controlling the time period, the number of cycles of the two phases, and the deposition/treatment gas components and flow ratios, the composition of the oxide spacer deposition layer, for example, Si-containing fluorocarbon polymer is controlled. For example, 15 cycles of the oxide spacer deposition phase using the oxide spacer deposition gas containing $CH_3F$, $SiH_4$, and Ar for 6 seconds, and the oxide spacer treatment phase using the treatment gas of $O_2$ for 2 seconds yields the polymer containing about 11.1% of C, about 1.8% of F, about 46.1% of Si, and about 41% of O. In another example, 15 cycles of the oxide spacer deposition phase using the oxid spacer deposition gas containing $CH_3F$, $SiH_4$, and Ar for 6 seconds, and the oxide spacer treatment phase using the treatment gas of $O_2$ for 6 seconds yields the polymer containing about 0% of C, about 1.1% of F, about 52.5% of Si, and about 46.3% of O. In another example, 15 cycles of the oxide spacer deposition phase using the oxide spacer deposition gas containing $CH_3F$, $SiH_4$, and Ar for 6 seconds, and the oxide spacer treatment phase using the treatment gas of $O_2$ and $N_2$ for 2 seconds yields the polymer containing about 5.4% of C, about 2.2% of F, about 47.7% of Si, and about 44.6% of O. In yet another example, 15 cycles of the oxide spacer deposition phase using the oxide spacer deposition gas containing $CH_3F$, $SiH_4$, and Ar for 6 seconds, and the oxide spacer treatment phase using the treatment gas of $O_2$ and $N_2$ for 6 seconds yields the polymer containing about 0% of C, about 0.8% of F, about 52% of Si, and about 47.1% of O.

By changing the ratio of carbon in the oxide spacer deposition layer, the etch selectivity against the organic mask and/or the underlying etch layer can be controlled. For example, if the organic mask and/or the underlying etch layer is carbon based, the oxide spacer deposition layer containing less carbon has more etch resistance during the organic mask etch process (step 110) and/or the etch layer etch process (step 112).

By repeating the depositing of a thin oxide spacer deposition layer and treating the oxide spacer layer for a plurality of cycles, the resulting deposition layer has more uniform quality and composition. If a thicker oxide spacer deposition layer is deposited in one oxide spacer deposition phase, the subsequent oxide spacer treatment phase ($O_2$ and/or $N_2$ plasma treatment) may not treat well inside the thick spacer deposition layer.

In the oxide spacer treatment phase in some examples, the 450 sccm $O_2$ can be changed to 450 sccm $N_2$ or 225 $O_2$ and 225 $N_2$. Examples of preferred pressure ranges may be between 100 mTorr to 800 mTorr. Examples of a preferred power ranges would be 200 to 1000 Watts at a frequency of 60 M Hz, 200 to 1000 Watts at a frequency of 27 MHz and/or 100 to 2000 Watts at a frequency of 2 M Hz.

The partial removal of the oxide spacer deposition layer (step 108) may use a fluorine containing etch gas. For example, $CF_4$, $C_4F_8$, $C_4F_6$, $CHF_3$, and $CH_3F$ combined with $O_2$, Ar, $N_2$, $H_2$, and He. The subsequent etch step for the organic mask and the ARC layer, may also use a florin containing etch gas, which for example, may be one of the gases described above for the partial removal of the oxide spacer deposition layer. Examples of gases that may be used for the removal of the organic and ARC layers are $O_2$, $N_2/H_2$, $O_2/CO$, $CO_2$, or COS.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for etching an etch layer disposed over a substrate and below an antireflective coating (ARC) layer and a patterned organic mask with mask features, the method comprising:
   (a) placing the substrate in a process chamber;
   (b) opening the ARC layer through the mask features of the patterned mask;
   (c) forming an oxide spacer deposition layer, the oxide spacer deposition layer including a top portion, side walls, and a bottom portion, the top portion covering a top of the organic mask, the side walls covering side walls of the organic mask, and the bottom portion covering a bottom of the mask features;
   (d) partially removing, by etching, the oxide spacer deposition layer on the organic mask, at least the top portion of the oxide spacer deposition layer being removed;
   (e) removing, by etching, the organic mask and the ARC layer;
   (f) etching the etch layer through the sidewalls of the oxide spacer deposition layer; and (g) removing the substrate from the process chamber, wherein (c) forming the oxide spacer deposition layer comprises a plurality of cycles, each cycle comprising:
a deposition phase including:
providing a flow of a deposition gas containing Si;
forming a plasma from the deposition gas; and
stopping the flow of the deposition gas; and
a treatment phase including:
providing a flow of a treatment gas containing at least one of $O_2$ or $N_2$;
forming a plasma from the treatment gas; and
stopping the flow of the treatment gas.

2. The method of claim 1, wherein (c) forming the oxide spacer deposition layer comprises three (3) to fifteen (15) cycles.

3. The method of claim 1 wherein (c) forming the oxide spacer deposition layer comprises about ten (10) cycles.

4. The method of claim 1, wherein the deposition gas includes Silane and hydrocarbon.

5. The method of claim 4, wherein the deposition gas includes $SiH_4$ and $CH_3F$.

6. The method of claim 4, wherein the deposition gas is substantially oxygen free.

7. The method of claim 1, wherein (c) forming the oxide spacer deposition layer comprises one (1) to twenty (20) cycles, each cycle comprising:
a deposition phase including:
providing a flow of a deposition gas containing Si;
forming a plasma from the deposition gas; and
stopping the flow of the deposition gas; and
a treatment phase including:
providing a flow of a treatment gas containing at least one of $O_2$ or $N_2$;
forming a plasma from the treatment gas; and
stopping the flow of the treatment gas.

8. The method of claim 7, wherein (d) partially removing further removes the bottom portion of the oxide spacer deposition layer formed on the bottom of the mask features.

9. The method of claim 8, wherein the method is performed at a room temperature.

10. The method of claim 7, wherein the deposition gas includes Silane and hydrocarbon.

11. The method of claim 7, wherein the deposition gas includes $SiH_4$ and $CH_3F$.

12. The method of claim 7, wherein the deposition gas is substantially oxygen free.

13. The method of claim 1, wherein (d) partially removing further removes the bottom portion of the oxide spacer deposition layer formed on the bottom of the mask features.

14. The method of claim 1, wherein the method is performed at a room temperature.

15. A computer implemented method for etching an etch layer disposed over a substrate and below an antireflective coating (ARC) layer and a patterned organic mask with mask features, the method comprising:
(a) placing the substrate in a process chamber;
(b) opening the ARC layer through the mask features of the patterned mask;
(c) forming an oxide spacer deposition layer, the oxide spacer deposition layer including a top portion, side walls, and a bottom portion, the top portion covering a top of the organic mask, the side walls covering side walls of the organic mask, and the bottom portion covering a bottom of the mask features, which comprises one (1) to twenty (20) cycles, each cycle, comprising:
a deposition phase including:
providing a flow of a deposition gas containing Si;
forming a plasma from the deposition gas; and
stopping the flow of the deposition gas; and
a treatment phase including:
providing a flow of a treatment gas containing at least one of $O_2$ or $N_2$;
forming a plasma from the treatment gas; and
stopping the flow of the treatment gas;
(d) partially removing, by etching, the oxide spacer deposition layer on the organic mask, at least the top portion of the oxide spacer deposition layer being removed;
(e) removing, by etching, the organic mask and the ARC layer;
(f) etching the etch layer through the sidewalls of the oxide spacer deposition layer; and
(g) removing the substrate from the process chamber.

16. The computer implemented method of claim 15, wherein the deposition gas includes $SiH_4$ and $CH_3F$.

17. The computer implemented method of claim 15, wherein the deposition gas is substantially oxygen free.

18. The method of claim 1, wherein each step of the method is performed at a room temperature.

* * * * *